(12) United States Patent
Park et al.

(10) Patent No.: US 8,797,276 B2
(45) Date of Patent: Aug. 5, 2014

(54) METHOD OF CONTROLLING HOME APPLIANCE HAVING TOUCH PANEL AND TOUCH PANEL HOME APPLIANCE USING THE SAME

(75) Inventors: Jong Seok Park, Gunpo-si (KR); Jae Kyung Lee, Daegu (KR)

(73) Assignee: LG Electronics Inc., Seoul (KR)

( * ) Notice: Subject to any disclaimer, the term of this patent is extended or adjusted under 35 U.S.C. 154(b) by 1277 days.

(21) Appl. No.: 12/375,260

(22) PCT Filed: Jan. 18, 2007

(86) PCT No.: PCT/KR2007/000296

§ 371 (c)(1),
(2), (4) Date: Aug. 31, 2009

(87) PCT Pub. No.: WO2008/013350

PCT Pub. Date: Jan. 31, 2008

(65) Prior Publication Data

US 2010/0020027 A1 Jan. 28, 2010

(30) Foreign Application Priority Data

Jul. 27, 2006 (KR) .................. 10-2006-0070901

(51) Int. Cl.
*G06F 3/041* (2006.01)

(52) U.S. Cl.
USPC .................. 345/173; 715/700; 348/14.05

(58) Field of Classification Search
USPC ......................... 345/173; 715/600
See application file for complete search history.

(56) References Cited

U.S. PATENT DOCUMENTS 6,211,856 B1 * 4/2001 Choi et al. ............... 345/666
6,560,612 B1 5/2003 Yamada et al.
(Continued)

FOREIGN PATENT DOCUMENTS

CN 1263616 8/2000
CN 2535849 2/2003
(Continued)

OTHER PUBLICATIONS

Chinese Office Action dated Jul. 3, 2012.
(Continued)

*Primary Examiner* — Grant Sitta
(74) *Attorney, Agent, or Firm* — KED & Associates LLP

(57) ABSTRACT

A method of controlling a home appliance having a touch panel and a touch panel home appliance using the same, such as a remote controller for controlling a television receiver, facilitate user recognition and selection of a specific function key displayed on a touchscreen, to enable enhanced control of the function key by a user desiring to step through many values of a range of values quickly and accurately. The method includes steps of displaying a main menu on the touchscreen of the touch panel, the main menu including at least one function key for controlling the home appliance, the touchscreen enabling a function key of the main menu to be selected by a user; displaying, in response to a user selection of one of the at least one function key, a set of enlarged keys corresponding to the selected function key of the main menu, the display of the enlarged keys on the touchscreen wholly replacing the display of the main menu; and executing, in response to a touch event with respect to the touchscreen displaying the set of enlarged keys, a control function corresponding to the selected function key, the control function having a parameter value set according to properties of the touch event.

27 Claims, 8 Drawing Sheets

(56) References Cited

U.S. PATENT DOCUMENTS

| | | | |
|---|---|---|---|
| 6,791,467 | B1 | 9/2004 | Ben-Ze'ev |
| 7,895,532 | B2* | 2/2011 | Scott et al. .................. 715/810 |
| 8,279,241 | B2* | 10/2012 | Fong .............................. 345/661 |
| 8,375,334 | B2* | 2/2013 | Nakano et al. ................ 715/848 |
| 2003/0035074 | A1 | 2/2003 | Dubil et al. |
| 2003/0066080 | A1* | 4/2003 | Kamieniecki .................. 725/80 |
| 2003/0164773 | A1* | 9/2003 | Young et al. ............. 340/825.72 |
| 2003/0204272 | A1* | 10/2003 | Niyama et al. .................. 700/17 |
| 2004/0041723 | A1* | 3/2004 | Shibamiya et al. ........... 341/176 |
| 2005/0005288 | A1* | 1/2005 | Novak ............................ 725/32 |
| 2005/0076309 | A1 | 4/2005 | Goldsmith |
| 2005/0125826 | A1* | 6/2005 | Hunleth et al. ................. 725/45 |
| 2006/0007176 | A1* | 1/2006 | Shen ............................ 345/173 |
| 2006/0025218 | A1 | 2/2006 | Hotta |
| 2006/0132457 | A1* | 6/2006 | Rimas-Ribikauskas et al. ............................ 345/173 |

FOREIGN PATENT DOCUMENTS

| | | |
|---|---|---|
| CN | 1604025 | 4/2005 |
| CN | 2764108 | 3/2006 |
| EP | 1 615 109 | 1/2006 |
| KR | 10-2001-0013878 | 2/2001 |

OTHER PUBLICATIONS

Korean Office Action dated Sep. 17, 2007.
International Search Report and Written Opinion dated Apr. 22, 2009.
Chinese Office Action dated Aug. 11, 2010.
Chinese Office Action dated Jul. 22, 2011 with English Translation (Application No. 200780032320.3).
Chinese Office Action dated Dec. 13, 2011. (200780032320.3).
European Search Report dated Oct. 30, 2012.
European Office Action for Application No. 07701013.0, dated Jun. 10, 2013.

* cited by examiner

FIG. 7A
FIG. 7B
FIG. 7C
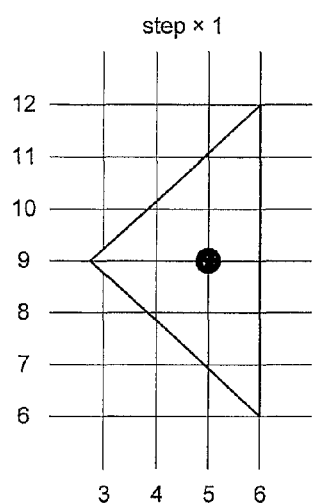
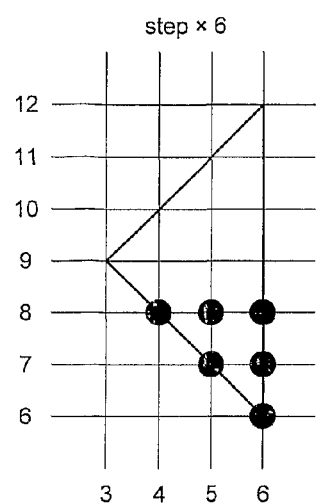
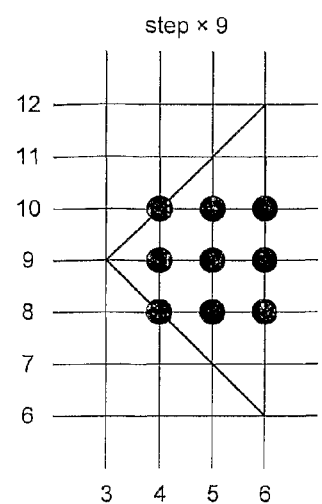

METHOD OF CONTROLLING HOME APPLIANCE HAVING TOUCH PANEL AND TOUCH PANEL HOME APPLIANCE USING THE SAME

TECHNICAL FIELD

The present invention relates to touch-panel-controlled home appliances, and more particularly, to a method of controlling a home appliance provided with a touch panel and to a touch panel home appliance using the same, in which a function of the home appliance is controlled according to properties of a touch event effected by a user, including properties of touch location/area and dragging direction/distance.

BACKGROUND ART

A general home appliance (e.g., a television receiver or a remote controller for controlling a television receiver) may be provided with a small display device or view screen for use in conjunction with the control of the appliance, for example, to confirm execution of a control function by updating a display status accordingly, and such a display device may be provided with a touch panel (also known as a touchscreen or touchscreen panel) as an input device enabling function selection, data input, and general control operations. Thus, touch panels enable the display device itself to be used for system control or data entry and may be provided to the home appliance in addition to or in lieu of conventional input devices such as a keypad. Touch panels are essentially display overlays enabling the display device to display and receive information via the same screen, and conventional touch panels include many types, which are generally classified according to the methodology of the input, e.g., resistive, capacitive, surface wave, infrared, strain gauge, optical imaging, and acoustic pulse recognition. Each of these types permits a stimuli that registers as a touch event.

Meanwhile, a home appliance may have design limitations for situating a touch panel display device on an outer panel, or there may be physical limitations on its size, as in the case of a relatively small home appliance such as a remote controller. Accordingly, a touch panel display device for use as a control panel of a home appliance is restricted in terms of available screen area, so that the display size of a graphics interface unit (GUI) or menu item (i.e., a displayed icon or key) should be minimized. In the event that multiple GUIs need to be simultaneously displayed, say, as part of a main menu array, an arrangement of several closely spaced GUIs, each of which is necessarily small, represents an inconvenience to users—particularly for users having overly large fingers, poor dexterity, weak eyesight, or other diminished capacity.

Furthermore, for a home appliance (e.g., a television receiver) digitally controlled according to a control function parameter (e.g., volume or channel number) that is variable over a wide range of values at increments demonstrating a comparatively high selectivity (or small step value), it is often desirable to change the value of the parameter from one setting to another by stepping through many values of the range. In such cases, the user is further burdened with the need to manipulate a function selection key, such as a step-up or step-down control key, by repetitively touching a specific key of a displayed menu numerous times to effect a desired change in value.

DISCLOSURE OF INVENTION

Accordingly, the present invention is directed to a method of controlling a home appliance having a touch panel and a touch panel home appliance using the same that substantially obviate one or more of the problems due to limitations and disadvantages of the related art.

An object of the present invention is to provide a method of controlling a home appliance having a touch panel and a touch panel home appliance using the same, which facilitates user recognition and selection of a specific key or menu item displayed on a touchscreen.

Another object of the present invention is to provide a method of controlling a home appliance having a touch panel and a touch panel home appliance using the same, which enables enhanced control of a function key by a user desiring to step through many values of a range of values quickly and accurately.

Another object of the present invention is to provide a method of controlling a home appliance having a touch panel and a touch panel home appliance using the same, which enables an increased flexibility in the methodology of key inputting by a user manipulating a function key for stepping through many values of a range of values.

Additional features and advantages of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the present invention, as embodied and broadly described, there is provided a method of controlling a home appliance using a touch panel having a touchscreen exhibiting a plurality of coordinates. The method comprises displaying a main menu on the touchscreen of the touch panel, the main menu including at least one function key for controlling the home appliance, the touchscreen enabling a function key of the main menu to be selected by a user; displaying, in response to a user selection of one of the at least one function key, a set of enlarged keys corresponding to the selected function key of the main menu, the display of the enlarged keys on the touchscreen wholly replacing the display of the main menu; and executing, in response to a touch event with respect to the touchscreen displaying the set of enlarged keys, a control function corresponding to the selected function key, the control function having a parameter value set according to properties of the touch event.

According to another aspect of the present invention, there is also provided a method of controlling a home appliance using a touch panel having a touchscreen exhibiting a plurality of coordinates, which comprises displaying a main menu on the touchscreen of the touch panel, the main menu including at least one function key for controlling the home appliance and the touchscreen enabling a function key to be selected by a user; displaying, in response to a user selection of one of the at least one function key, a set of enlarged keys corresponding to the selected function key of the main menu, the display of the enlarged keys on the touchscreen wholly replacing the display of the main menu; and effecting a touch event with respect to the touchscreen displaying the set of enlarged keys, the touch event executing a control function corresponding to the selected function key and having a parameter value set according to properties of the touch event, the control function executed by one of a stepped increase of the parameter value and a stepped decrease of the parameter value.

According to another aspect of the present invention, there is provided a touch panel home appliance comprising a touch panel having a touchscreen exhibiting a plurality of coordinates; and a controller for controlling the touchscreen of the touch panel to display a main menu on the touchscreen, the main menu including at least one function key for controlling the touch panel home appliance and the touchscreen enabling a function key to be selected by a user, and for controlling the touchscreen of the touch panel to display, in response to a user selection of one of the at least one function key, a set of enlarged keys corresponding to the selected function key of the main menu, so that the display of the enlarged keys on the touchscreen wholly replaces the display of the main menu, wherein the controller executes, in response to a touch event with respect to the touchscreen displaying the set of enlarged keys, a control function corresponding to the selected function key and having a parameter value set according to properties of the touch event.

It is to be understood that both the foregoing general description and the following detailed description are exemplary and explanatory and are intended to provide further explanation of the invention as claimed.

BRIEF DESCRIPTION OF DRAWINGS

The accompanying drawings, which are included to provide a further understanding of the invention and are incorporated in and constitute a part of this specification, illustrate embodiment(s) of the invention and together with the description serve to explain the principles of the invention. In the drawings:

FIGS. 7A-7C are exemplary diagrams of respective touch events for controlling the volume-down function of the main menu of FIG. 3, showing various stepping rates obtained according to a touch area.

BEST MODE FOR CARRYING OUT THE INVENTION

Figure 1:
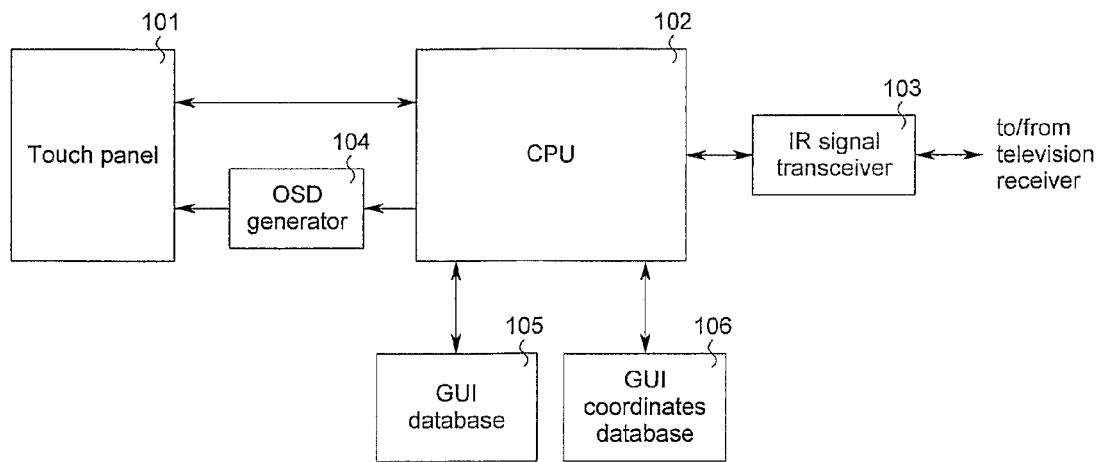
FIG. 1 is a block diagram of a touch panel remote controller according to the present invention.

Referring to FIG. 1, a touch panel remote controller according to the present invention includes a touch panel 101 including a touchscreen exhibiting a plurality of coordinates and a touch panel controller (not shown) for converting an analog voltage value generated by a touch event into a corresponding coordinate value, a central processing unit (CPU) 102 as a controller of the overall system, an infrared (IR) signal transceiver 103, an on-screen display (OSD) generator 104, a graphic user interface (GUI) database 105, and a GUI coordinates database 106. Such a touch panel remote controller is typically configured with a general television receiver (not shown).

Accordingly, the IR signal transceiver 103 of the present invention is essentially an interface unit for communicating function control commands, using input/output signals, with respect to the touch panel home appliance of the present invention, e.g., a television receiver. In this case, the CPU 102 generates a key code corresponding to a control parameter of the television receiver (home appliance) and transmits the key code to the television receiver by encoding the key code into an infrared signal. The CPU 102 may receive feedback from the home appliance as necessary, for example, to confirm execution of a control function by updating a display status (OSD output) of the touchscreen of the touch panel 101 accordingly.

According to the present invention, a main menu is made up of at least one function key for controlling the home appliance, for example, a power key (PWR), an auxiliary key (AUX), a volume-down key (VOL−), a volume-up key (VOL+), a channel-down key (CH−), a channel-up key (CH+), a menu key (MENU), and an input key (IN). Additional or alternative function keys may be provided according to manufacturer or according to the home appliance adopting the present invention. For example, function keys for incrementally (up or down) adjusting temperature, brightness, or other function control parameter may be added or substituted for the volume-up/down keys and channel-up/down keys of the touch panel remote controller of the present invention.

In response to a user selection (touch) of a function key of the main menu, the touch panel remote controller of the present invention displays only a submenu made up of enlarged GUIs. For example, in the event of selecting a volume-related function, an arrangement of a volume-down key and a volume-up key may be displayed in an enlarged form, and additional enlarged function keys such as "MUTE" and "BACK" may be included in the submenu. On the other hand, in the event of selecting a channel-related function, an arrangement of a channel-down key and a channel-up key may be displayed in an enlarged form, and additional enlarged function keys such as "CH#" and "BACK" may be included in the submenu. A set of numerical keys (i.e., 0~9) may be included among the additional enlarged function keys displayed in response to a channel-related function selection, to simply enter the desired channel number directly, or further submenus may be provided in response to a user selection from any submenu; for example, the numerical keys may be displayed in response to a user selection of the channel number key (CH#).

The above GUIs, including the function keys of the main menu and the enlarged GUIs of the submenus, are displayed on the touch panel 101 with reference to the GUI database 105 and the GUI coordinates database 106. The GUI database 105 includes a set of GUIs, each corresponding to a function key of the main menu and each submenu, and the GUI coordinates database 106 includes a set of coordinates stored in correspondence to each displayed function key. Accordingly, in response to a control signal from the CPU 102, the OSD generator 104 generates OSD data for displaying the GUIs on the touchscreen of the touch panel 101. The displayed GUIs include those of the main menu, which is displayed under default conditions such as power on, and those of the various submenus, i.e., enlarged GUIs, which are displayed in response to a user selection of a specific function key. In particular, with a user selection of one function key from the main menu, the OSD generator 104 displays only the enlarged GUIs corresponding to the selected function key.

That is, the OSD generator 104 generates, under control of the CPU 102, OSD data for displaying graphics user interface (GUI) devices on the touchscreen of the touch panel 101. The GUI devices correspond to the enlarged keys, which are displayed on the touchscreen in place of the display of the main menu, and the at least one function key of the main menu. The GUI database 105 includes an arrangement of keys in association with values of the plurality of coordinates, while the GUI coordinates database 106 includes coordinates values of the keys of the GUI database, such that the databases are searchable according to the user selection of one of the at least one function key. Thus, for a touch event with respect to an enlarged function key, the CPU 102 generates a corresponding key code by referring to the GUI database 105 and the GUI coordinates database 106. The key code is generated according to the type of touch event registered and according to a system program for processing the corresponding touch event.

Accordingly, a main menu including at least one function key is first displayed on the screen of a touch panel, and a user selects one of the displayed function keys. As a result, the screen displays only an enlarged GUI corresponding to the selected function key, and by touching the screen with respect to the enlarged GUI, a specific key code is generated for executing a corresponding function. The selectable functions of the main menu correspond to an incremental (up or down) adjustment of a control function parameter (volume, channel number, temperature, brightness, etc.), and to determine an incrementing rate—either up or down—for changing the corresponding parameter of the selected control function, it is first determined which type of touch event is being registered. The touch event may be a touch location with respect to a reference coordinate, a touch area with respect to an enlarged GUI, a dragging distance with respect to a determined touch motion directionality, or a dragging speed with respect to a determined touch motion directionality. In the event that a touch event has selected a stepped increase or decrease of the control function parameter, the rate of change in the parameter may be determined by the touch location or the touch area. On the other hand, in the event that a touch event corresponds to the dragging of a curser, a touch motion directionality (i.e., dragging direction) first determines whether the control function parameter is to be changed by a stepped increase or a stepped decrease, and then the rate of change in the parameter may be determined by the dragging distance or the dragging speed.

The characteristics of the above various touch events of the present invention are determined by an analog voltage output of the touch panel 101, which may comprise a touch sensor (not shown) having a grid structure corresponding to the plurality of coordinates (x, y). That is, an analog voltage value is generated in correspondence to a user selection with respect to the plurality of coordinates, through a pressing of one point of the grid or a simultaneous pressing more than one point. Then, using a internal memory such as an EEPROM (not shown), the touch panel controller of the touch panel 101 converts the generated analog voltage value into a corresponding coordinates value, which is then output to the CPU 2.

For example, to determine the touch location of a touch event, a reference coordinate (x or y value) is considered, and the reference coordinate may correspond to one side of an enlarged GUI. Meanwhile, a valid area of a touch event (touch area) can be determined in accordance with the analog voltage values generated by a simultaneous pressing at more than one point of the gird. Movement-based properties of the touch event, including its directionality, distance, and speed, can be detected by sampling the output of the touch sensor over time. Based on the input coordinates from the touch panel controller of the touch panel 101, the CPU 2 determines the corresponding touch event with reference to the GUI database 105 and the GUI coordinates database 106.

Figure 2:
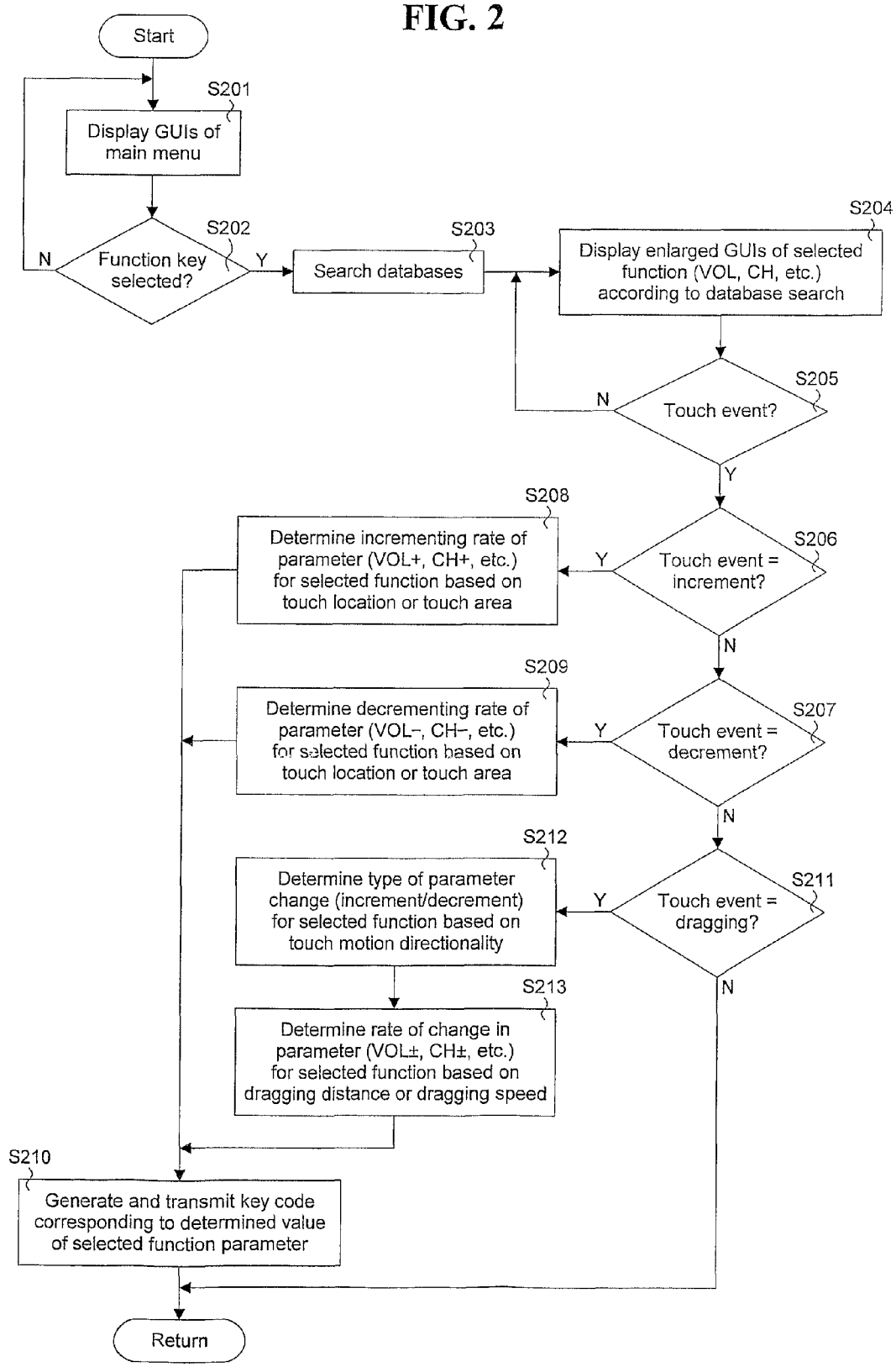
FIG. 2 is a flowchart of a method of controlling a touch panel home appliance according to the present invention.

FIG. 2 illustrates a method of controlling a touch panel home appliance according to the present invention. First, the GUIs of the main menu are displayed on the screen of the touch panel 101 under default conditions such as power on (S201).

Figure 3:
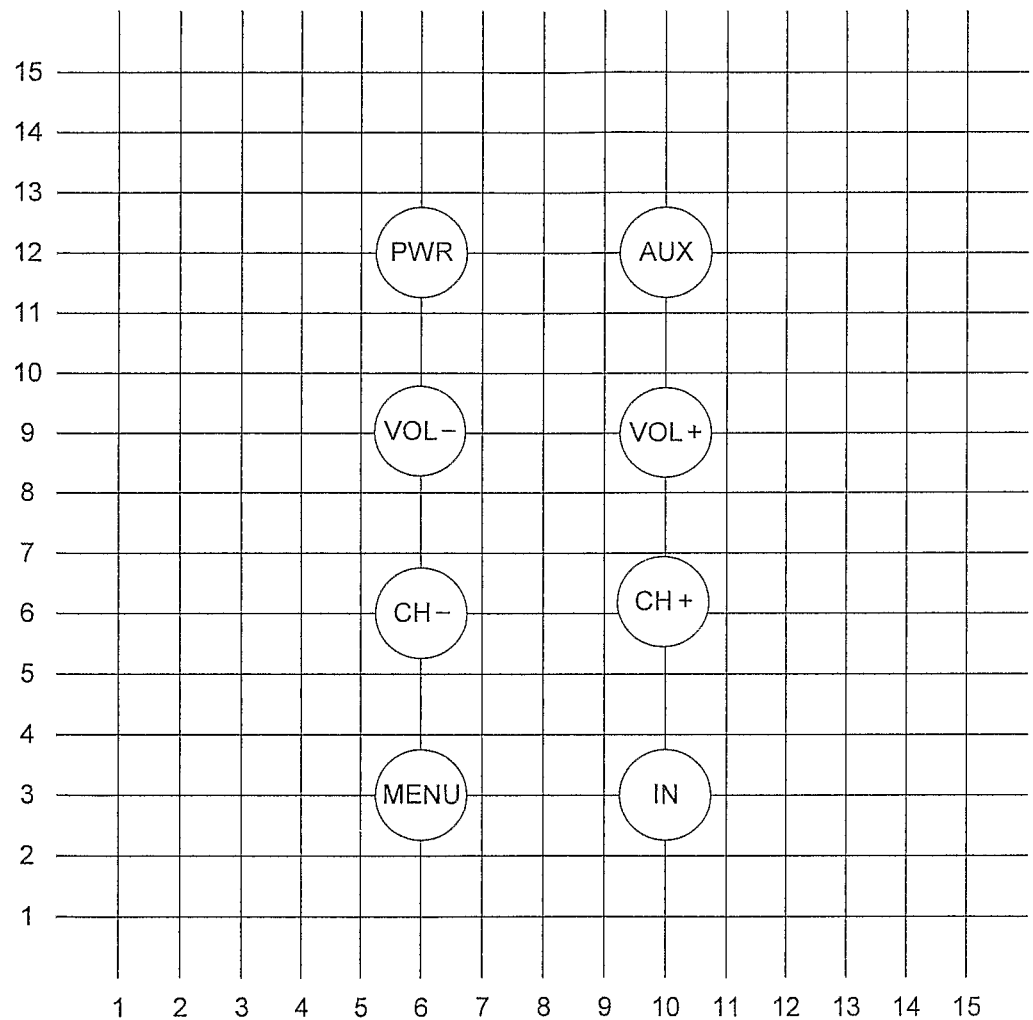
FIG. 3 is an exemplary diagram of a main menu displayed on the screen of the touch panel of FIG. 1.

That is, a main menu is displayed as in FIG. 3. The main menu may include such function keys as a power key (PWR), an auxiliary key (AUX), a volume-down key (VOL−), a volume-up key (VOL+), a channel-down key (CH−), a channel-up key (CH+), a menu key (MENU), and an input key (IN). Additional or alternative function keys may be provided according to manufacturer or according to the home appliance adopting the present invention. For example, function keys for incrementally (up or down) adjusting temperature, brightness, or other function control parameter may be added or substituted for the volume-up/down keys and channel-up/down keys of the touch panel remote controller of the present invention.

Subsequently, the CPU 102 determines whether there is a user selection of one of the displayed function keys of the main menu (S202). While the touch panel home appliance of the present invention may directly execute the control function according to the selection of the step S202, an enhancement of the selected function may be obtained through a display of one or more enlarged GUIs corresponding to the function selection. To do so, the GUI database 105 and GUI coordinates database 106 are searched (S203). Then, in response to the function key selection from the main menu, a set of enlarged GUIs corresponding to the selected function wholly replaces the main menu display (S204).

Figure 4A:
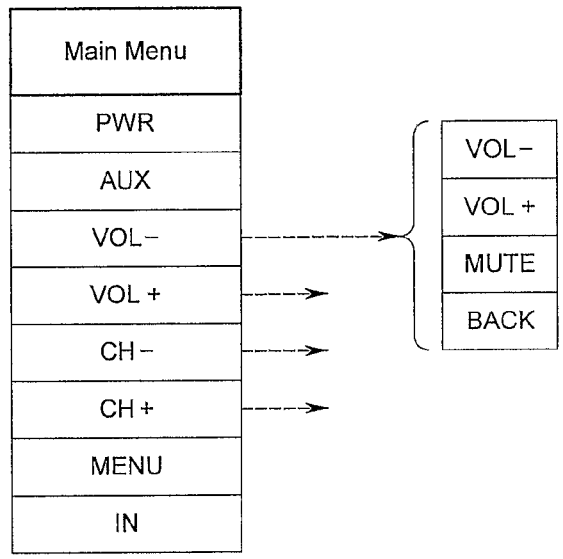
FIG. 4A is an exemplary diagram of the structure of the GUI database of FIG. 1.
Figure 4B:
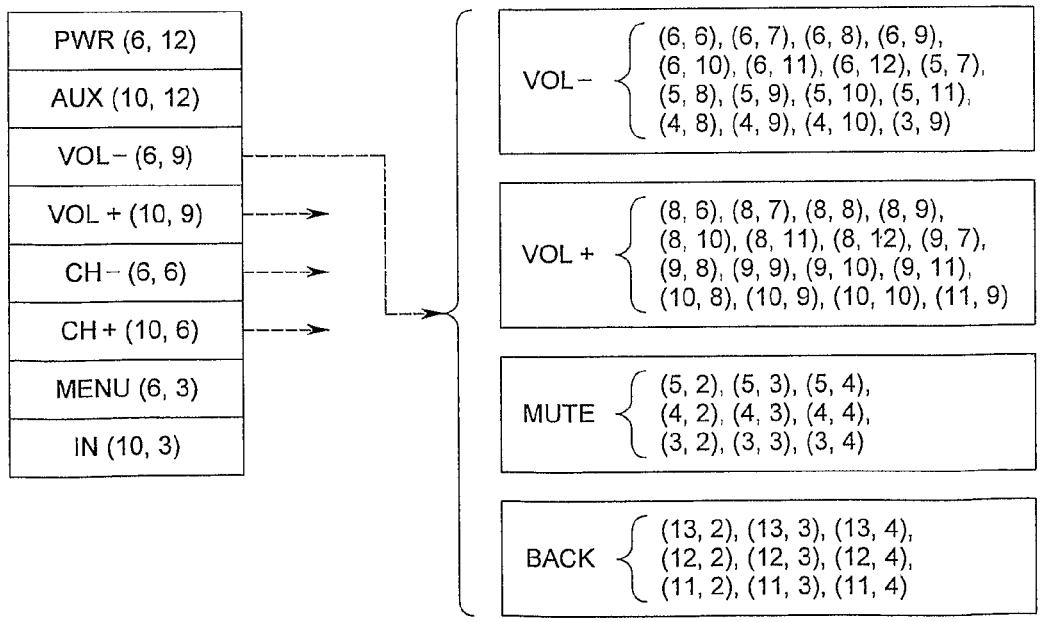
FIG. 4B is an exemplary diagram of the structure of the GUI coordinates database of FIG. 1.
Figure 5A:
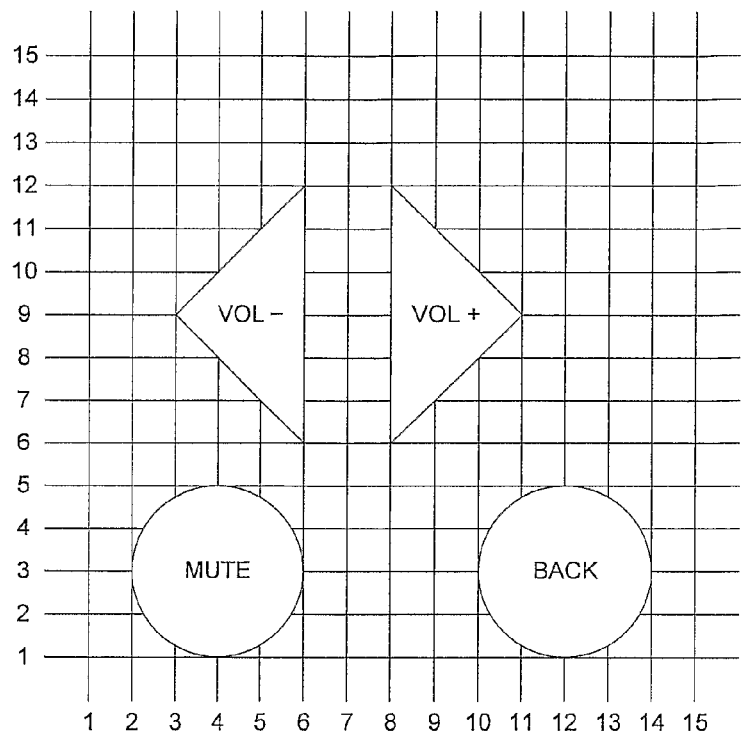
FIG. 5A is an exemplary diagram of a set of enlarged GUIs displayed in response to a volume-related function selection from the main menu of FIG. 3.
Figure 5B:
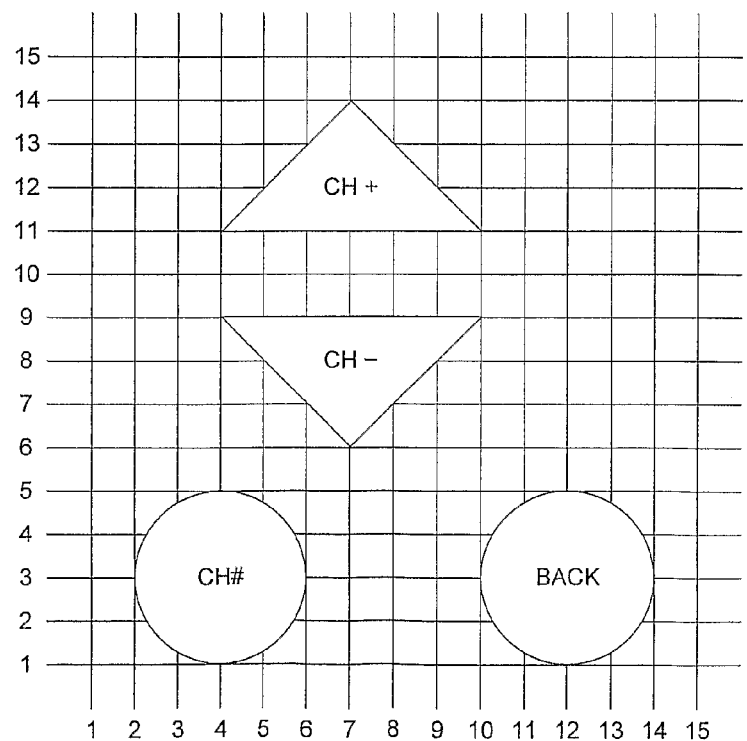
FIG. 5B is an exemplary diagram of a set of enlarged GUIs displayed in response to a channel-related function selection from the main menu of FIG. 3.

That is, in response to a selection from the main menu, the databases of FIGS. 4A and 4B are searched to display a set of enlarged GUIs, for example, as in FIG. 5A or 5B, to facilitate user recognition of specific keys for adjusting the volume or selecting a channel. Here, it should be appreciated that a selection of either of the volume-down key or the volume-up key (or one of the channel-related keys, i.e., CH− or CH+) of the main menu may result in a display of both types of enlarged keys (e.g., VOL− and VOL+) or the display may correspond to the specific function key selection, so that the set of enlarged GUIs may consist of a single key (e.g., VOL− or VOL+). In the examples as shown throughout, only volume-down stepping is described, but the same concept is applicable for volume-up stepping as well as incremental (up and down) adjustments of the channel number or any other function control parameter that may be adjusted by stepping up or stepping down through a series of value settings. It should be further appreciated that the relatively low resolution exemplified in FIGS. 5A and 5B is merely representative and would typically be much higher. When an enlarged GUI is activated, a corresponding graphic user interface (GUI) function is executed, after which the screen may return to a main menu display.

With the enlarged GUIs corresponding to a selected function displayed according to the step S204, the CPU 102 determines whether a touch event has occurred by checking whether the touch event is registered by the touch panel controller of the touch panel 101 (S205). According to one embodiment of the present invention, it may be determined that the touch event corresponds to one of an incrementing step and a decrementing step (S206, S207). At this time, the stepping rate may simply be set to a predetermined value, whereby a corresponding key code is generated to increase or decrease the parameter value according to the number of touch events successively registered anywhere within an enlarged GUI area at least one pair of coordinates. On the other hand, to assist the user in controlling the corresponding function, e.g., volume or channel number, the stepping rate may be executed according to a multiple of the predetermined value. For example, the incrementing or decrementing rate of the selected function parameter (VOL±, CH±, TEMP±, BRIGHT±, etc.) may be determined based on a touch location set by the touch event or based on a touch area set by the touch event (S208, S209). In other words, the control function is executed by one of a stepped increase of the parameter value and a stepped decrease of the parameter value.

Figure 6A:
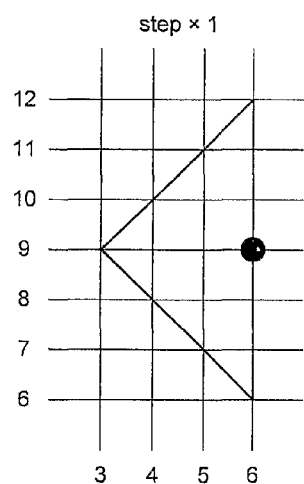
FIGS. 6A-6C are exemplary diagrams of respective touch events for controlling the volume-down function of the main menu of FIG. 3, showing various stepping rates obtained according to a touch location.
Figure 6B:
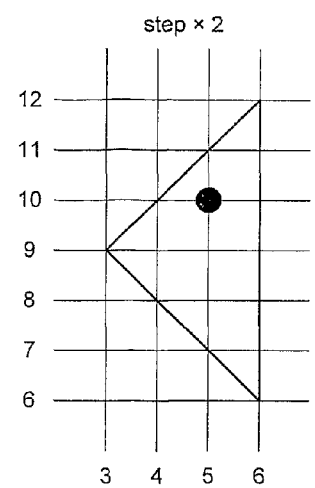
Figure 6C:
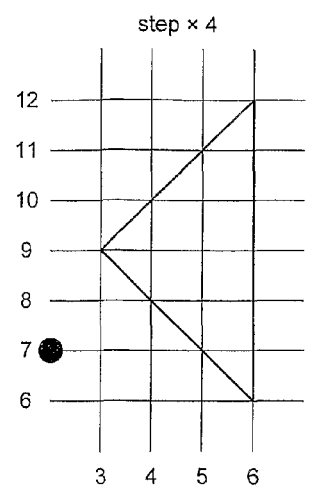

That is, a volume-up (or channel-up) rate may be set according to the location of the touch event of the step S206, and a volume-down (or channel-down) rate may be set according to the location of the touch event of the step S207. For example, referring FIGS. 6A-6C, a touch event for determining the decrementing rate of the corresponding parameter (e.g., VOL−) may be referenced, for example, to one side of the volume-down key (x=6) or to another x coordinate of the screen of the enlarged GUIs as displayed in FIG. 5A. In FIG. 5B, for example, such a reference coordinate would be a y value of, say, y=9 for a channel-down step. Thus, as the touch location gets farther away from the referenced coordinate, the volume (or channel number) is decreased at a faster rate. In particular, a touch location of (6, 9) may correspond to a base rate, i.e., step×1 as in FIG. 6A; a touch location of (5, 10) may correspond to a doubling of the base rate, i.e., step×2 as in FIG. 6B; and a touch location of (2, 7) may correspond to four times the base rate, i.e., step×4 as in FIG. 6C. In other words, the stepping rate corresponds to a distance between a coordinate of the touch event and a reference coordinate of the touchscreen.

Meanwhile, a volume-up (or channel-up) rate may be set according to the valid area of the touch event of the step S206, and a volume-down (or channel-down) rate may be set according to the valid area of the touch event of the step S207. For example, referring FIGS. 7A-7C, a touch event for determining the decrementing rate of the corresponding parameter (e.g., VOL−) may be referenced, for example, to a single pair of valid coordinates occurring anywhere within the enlarged volume-down key. Thus, as the touch area gets bigger, the volume (or channel number) is decreased at a faster rate. In particular, a touch area of a single valid coordinate pair, namely, (5, 9), may correspond to a base rate, i.e., step×1 as in FIG. 7A; a touch area of six valid coordinate pairs, namely, {(6, 6), (6, 7), (6, 8), (5, 7), (5, 8), (4, 8)}, may correspond to six times the base rate, i.e., step×6 as in FIG. 7B; and a touch area of nine valid coordinate pairs, namely, {(6, 8), (6, 9), (6, 10), (5, 8), (5, 9), (5, 10), (4, 8), (4, 9), (4, 10)}, may correspond to nine times the base rate, i.e., step×9 as in FIG. 7C. In is other words, the stepping rate is proportional to a count of touched coordinates in the touch area.

Referring again to FIG. 2, the CPU 102 generates a key code corresponding to the value determined by the touch event of the step S205 and transmits the generated key code to the home appliance, e.g., television receiver, to effect a control of the selected function (S210). The key code may be transmitted via an interfacing device such as the IR signal transceiver 103.

In another embodiment of the present invention, the touch event may be effected by a dragging of a cursor over a minimum distance in a predetermined direction (S211). In this case, the type of parameter change, i.e., an increment or decrement performed according to one of the steps S206 and S207, is determined based on the directionality of the touch motion or dragging action (S212). With directionality thus determined, the rate of change in the parameter, for the selected function of the step S202 is determined based on the distance of the dragging or by its speed (S213).

Figure 8A:
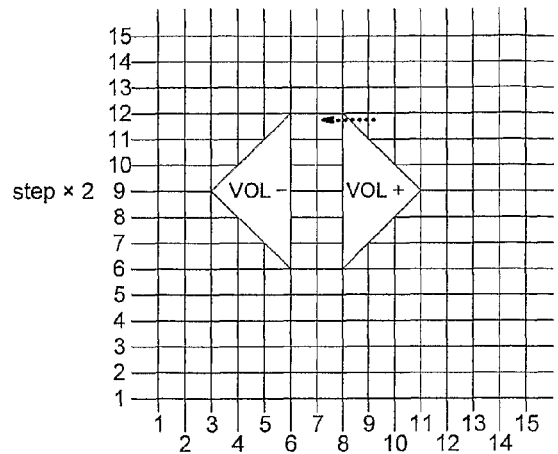
FIGS. 8A-8C are exemplary diagrams of respective touch events for controlling the volume-down function of the main menu of FIG. 3, showing various stepping rates obtained according to a dragging distance.
Figure 8B:
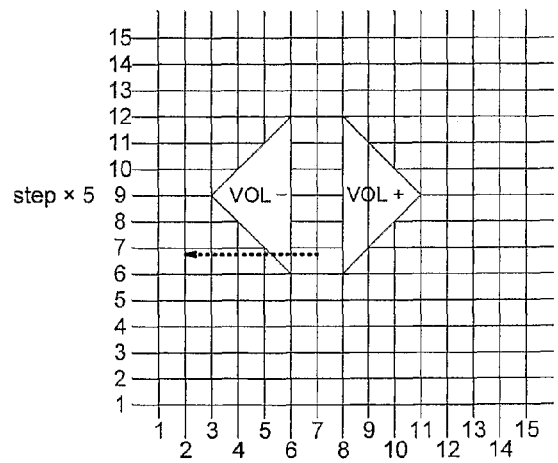
Figure 8C:
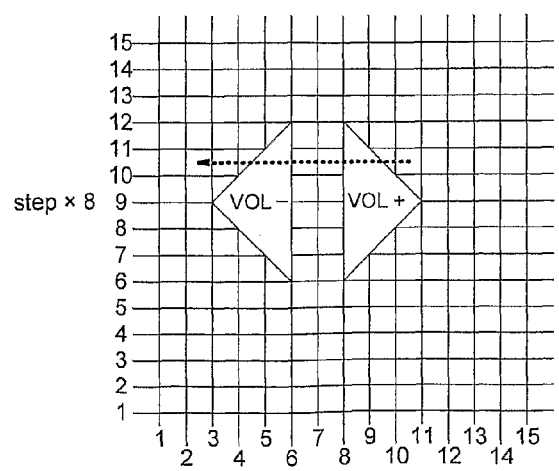

For example, as shown in FIGS. 8A-8C, a volume-down rate may be set according to the directionality determined for the touch event of the step S211. Thus, as the touch motion increases in distance, the volume is decreased at a faster rate. In particular, a right-to-left touch motion spanning a distance such as in FIG. 8A of, say, two units of the x coordinate, may correspond to twice the base rate, i.e., step×2; a right-to-left touch motion spanning a distance such as in FIG. 8B of, say, five units of the x coordinate, may correspond to five times the base rate, i.e., step×5; and a right-to-left touch motion spanning a distance such as in FIG. 8C of, say, eight units of the x coordinate, may correspond to eight times the base rate, i.e., step×8. Here, the directionality for an increase in volume would be from left to right, while the directionality for a change in channel number may be along a vertical (see FIG. 5B). Therefore, the directionality is first determined as one of a first or second direction, and is preferably where the first and second directions are preferably opposite directions to provide for maximum selectively in directionality detection. In other words, the stepping rate increases as the dragging proceeds from a step-down key of the set of enlarged keys to a step-up key of the set of enlarged keys, and conversely, the stepping rate decreases as the dragging proceeds from the step-up key of the set of enlarged keys to the step-down key of the set of enlarged keys.

Therefore, according to the present invention, a home appliance using a touch panel having a touchscreen exhibiting a plurality of coordinates is controlled by first displaying a main menu on the touchscreen of the touch panel, where the main menu includes at least one function key for controlling the home appliance. Then, in response to a selected function key, a set of enlarged keys corresponding to the selected function key of the main menu is displayed on the touchscreen is place of the display of the main menu. Finally, in response to a touch event with respect to the touchscreen displaying the set of enlarged keys, a control function corresponding to the selected function key and having a parameter value set according to properties of the touch event is executed by generating a key code corresponding to the parameter value of the control function and transmitting the generated key code to the home appliance. Embodiments of the present invention may vary based on whether the properties of the touch event include a touch location effected with respect to a reference coordinate of the touchscreen, a touch area effected with respect to a valid area of the touchscreen, a dragging distance of a curser with respect to its directionality, or a dragging speed of the curser with respect to its directionality.

INDUSTRIAL APPLICABILITY

By adopting the present invention, since an OSD menu comprised of a predetermined set of GUIs corresponding to a specific function is enlarged and displayed in lieu of a main menu in response to a function selection, user recognition and selection of a specific function key displayed on a touchscreen is facilitated to enable enhanced control of a function key by a user desiring to step through many values of a range of values quickly and accurately. By determining the value of stepped parameter based on properties of a touch event effected by a user with respect the display of the enlarged keys (GUIs), the present invention provides an increased flexibility in the methodology of key inputting by a user manipulating a function key for stepping through many values of a range of values. Due to this enhanced methodology for data input, operation of a control panel (touch panel) of a home appliance is facilitated for a user exhibiting or temporarily experiencing poor or reduced sensory perception, e.g., eyesight, and for a user having weak, impaired, or underdeveloped dexterity, strength, or other faculties—such as in the case of the infirm, a child, or an elderly person.

It should be appreciated that a home appliance according to the present invention, to which a touch panel for performing the method of the present invention is provided, may be a remote controller for controlling another home appliance. In other words, a remote controller having a touch panel may itself be a touch panel home appliance, whereby the method of the present invention controls the remote controller, which in turn controls another device, such as a component of a home entertainment system (e.g., television receiver), an air conditioner, an electric heater, a kitchen appliance, or a dimmer switch. For example, an air conditioner, an electric heater, or other home appliance controlled with respect to temperature can be controlled according to a range of temperature values, while a similar control of a dimmer switch can be made according to a range of desired room brightness (illumination values). In any case, a corresponding control function can be executed in response to a touch event effected with respect to the touchscreen displaying the set of enlarged keys.

While the present invention has been described and illustrated herein with reference to one or more preferred embodiments, it will be apparent to those skilled in the art that various modifications can be made in the present invention without departing from the spirit or scope of the invention. Thus, it is intended that the present invention covers such modifications provided they come within the scope of the appended claims and their equivalents.

What is claimed is:

1. A method of controlling a television receiver in a remote controller using a touch panel having a touchscreen exhibiting a plurality of coordinates, the method comprising:
   storing structure info nation between a main menu and a sub menu in a database (DB);
   displaying a main menu on the touchscreen of the touch panel, the main menu including at least one function key for controlling the television receiver, the touchscreen enabling a function key of the main menu to be selected by a user;
   displaying, in response to a first user selection of one of the at least one function key within the main menu, a sub menu that includes a set of keys corresponding to the selected function key of the main menu according to the stored structure information, and the display of the sub menu on the touchscreen wholly replacing the display of the main menu on the touchscreen;
   determining a type of parameter change for a second user selection based on a touch motion directionality, wherein the second user selection relates to the television receiver's function;
   determining a rate of change in parameter for the second user selection based on a dragging distance, wherein at least a key code corresponding to each dragging distance is pre-stored in the database; and
   transmitting, in response to the second user selection of one of the set of keys within the sub menu, a key code corresponding to the second user selection to the television receiver.

2. The method of claim 1, wherein properties of the second user selection include a touch location effected with respect to a reference coordinate of the touchscreen.

3. The method of claim 1, wherein properties of the second user selection include a touch area effected with respect to a valid area of the touchscreen.

4. The method of claim 1, wherein properties of the second user selection include a touch motion directionality of a dragging of a curser on the touchscreen and at least one of a dragging distance of the curser and a dragging speed of the curser.

5. The method of claim 1, wherein the at least one function key of the main menu and the set of keys are displayed on the touchscreen as graphics user interface (GUI) devices.

6. The method of claim 1, wherein said transmitting the key code comprises:
   generating a key code corresponding to a parameter value of a control function; and
   transmitting the generated key code to the television receiver.

7. The method of claim 1, wherein the transmitted key code is encoded into an infrared signal.

8. The method of claim 1, wherein a control function is executed by one of a stepped increase of a parameter value and a stepped decrease of the parameter value.

9. The method of claim 8, further comprising:
   determining, based on the second user selection, which of the stepped increase of the parameter value and the stepped decrease of the parameter value is used in said transmitting of the key code.

10. The method of claim 1, further comprising:
    determining, based on the second user selection, a stepping rate of a parameter value, wherein the stepping rate corresponds to a distance between a coordinate of the second user selection and a reference coordinate of the touchscreen.

11. The method of claim 10, wherein the stepping rate increases as the second user selection effects a touch location having an increased distance from the reference coordinate of the touchscreen, and wherein the stepping rate decreases as the second user selection effects a touch location having a decreased distance from the reference coordinate of the touchscreen.

12. The method of claim 1, further comprising:
    determining, based on a touch event, a stepping rate of the second user selection parameter value, wherein the stepping rate corresponds to a touch area effected by the second user selection.

13. The method of claim 12, wherein the stepping rate increases as the touch area increases with respect to a valid area of the set of keys, and wherein the stepping rate decreases as the touch area decreases with respect to the valid area of the set of keys.

14. The method of claim 12, wherein the stepping rate is proportional to a count of touched coordinates in the touch area.

15. The method of claim 1, wherein the second user selection includes a dragging of a cursor.

16. The method of claim 1, further comprising:
    determining, based on the second user selection, a stepping rate of a parameter value, wherein the stepping rate corresponds to at least one of a dragging distance of a curser and a dragging speed of the curser.

17. The method of claim 16, wherein the stepping rate increases as the dragging distance of the curser increases, and wherein the stepping rate decreases as the dragging distance of the curser decreases.

18. The method of claim 16, wherein the stepping rate increases as the dragging speed of the curser increases, and wherein the stepping rate decreases as the dragging speed of the curser decreases.

19. The method of claim 16, wherein the stepping rate increases as the dragging proceeds from a step-down key of the set of keys to a step-up key of the set of keys, and wherein the stepping rate decreases as the dragging proceeds from the step-up key of the set of keys to the step-down key of the set of keys.

20. The method of claim 1, further comprising:
searching, according to a user selection of one of the at least one function key, a graphics user interface (GUI) database for keys in association with values of the plurality of coordinates and a GUI coordinates database including coordinates values of the keys of the GUI database.

21. A remote controller having a touch panel, wherein the remote controller to wirelessly couple to a television receiver, the remote controller comprising:
a memory configured to store structure information between a main menu and a sub menu in a database (DB);
a touch panel configured to have a touchscreen to exhibit a plurality of coordinates; and
a controller configured to control the touchscreen of said touch panel to display the main menu on the touchscreen, the main menu including at least one function key for controlling the television receiver and the touchscreen enabling a function key of the main menu to be selected by a user, and to control the touchscreen of said touch panel to display, in response to first user selection of one of the at least one function key within the main menu, a sub menu that includes a set of keys corresponding to the selected function key of the main menu according to the stored structure information, and the display of the sub menu on the touchscreen wholly replaces the display of the main menu on the touchscreen,
wherein the controller to determine a type of parameter change for a second user selection based on a touch motion directionality, wherein the second user selection relates to the television receiver's function, and the controller to determine a rate of change in parameter for the second user selection based on a dragging distance, wherein at least a key code corresponding to each dragging distance is pre-stored in the database.

22. The remote controller of claim 21, further comprising:
an OSD generator for generating, under control of said controller, OSD data for displaying graphics user interface (GUI) devices on the touchscreen of said touch panel, the GUI devices corresponding to the at least one function key of the main menu and the keys displayed on the touchscreen in place of the display of the main menu.

23. The remote controller of claim 21, further comprising:
a graphics user interface (GUI) database including an arrangement of keys in association with values of the plurality of coordinates; and
a GUI coordinates database including coordinates values of the keys of said GUI database, wherein said GUI database and said GUI coordinates database are searchable according to the user selection of one of the at least one function key.

24. The remote controller of claim 21, further comprising:
an interface unit for communicating function control commands with respect to the remote controller according to the execution of the control function by said controller.

25. The remote controller of claim 21, further comprising:
an IR signal transceiver configured to transmit, in response to second user selection of one of the set of keys within the sub menu, a key code corresponding to the second user selection to the television receiver, wherein the key code is encoded into infrared signal before the transmitting of the key code, and the key code is pre-stored in the database.

26. The method of claim 1, wherein the main menu and the sub menu are hierarchically arranged.

27. The remote controller of claim 21, wherein the main menu and the sub menu are hierarchically arranged.

* * * * *